(12) United States Patent
Draxelmayr (10) Patent No.: US 9,912,341 B2
(45) Date of Patent: Mar. 6, 2018

(54) DATA CONVERSION WITH REDUNDANT SPLIT-CAPACITOR ARRANGEMENT

(71) Applicant: Infineon Technologies AG, Neubiberg (DE)

(72) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/783,054

(22) Filed: Mar. 1, 2013

(65) Prior Publication Data
US 2014/0247177 A1  Sep. 4, 2014

(51) Int. Cl.
| | |
|---|---|
| *H03M 1/12* | (2006.01) |
| *H03M 1/06* | (2006.01) |
| *H03M 1/00* | (2006.01) |
| *H03M 1/80* | (2006.01) |
| *H03M 1/46* | (2006.01) |

(52) U.S. Cl.
CPC ............ *H03M 1/0692* (2013.01); *H03M 1/00* (2013.01); *H03M 1/12* (2013.01); *H03M 1/468* (2013.01); *H03M 1/804* (2013.01)

(58) Field of Classification Search
CPC ........... H03M 1/804; H03M 1/00; H03M 1/12
USPC ........ 341/172, 162, 156, 155, 110, 122, 133
See application file for complete search history.

(56) References Cited

U.S. PATENT DOCUMENTS 8,094,057 B2 *  1/2012  Haneda ......................... 341/162

* cited by examiner

*Primary Examiner* — Joseph Lauture
(74) *Attorney, Agent, or Firm* — Shumaker & Sieffert, P.A.

(57) ABSTRACT

Representative implementations of devices and techniques provide analog to digital conversion of time-discrete analog inputs. A redundant split-capacitor arrangement using a successive approximation technique can provide a fast and power efficient ADC. For example, a successive approximation capacitor arrangement may include multiple arrays with non-binary bit weights.

24 Claims, 5 Drawing Sheets

ID ATA CONVERSION WITH REDUNDANT SPLIT-CAPACITOR ARRANGEMENT

BACKGROUND

Analog-to-digital converters (ADCs) convert time-discrete analog input values to a digital form. A type of ADC, the successive approximation (SA) ADC, digitizes the analog input values using a successive approximation search algorithm. While the internal circuitry of the SA-ADC may run at a higher frequency (such as several megahertz (MHz), for example), the sample rate of the SA-ADC is generally a fraction of that frequency (such as several kilohertz (kHz), for example) due to the successive approximation search algorithm used. For example, normally each bit of the SA-ADC is fully realized prior to proceeding on to the next bit.

In general, each bit-weight of a successive approximation register (SAR) arrangement of a SA-ADC may be represented by a physical element (e.g., capacitor, resistor, current source, etc.). A search algorithm may be used with the physical elements to determine the closest digital approximation to an analog input value. Commonly, a binary search algorithm is used with an arrangement having physical elements with binary bit-weights, for example. While this technique may be the simplest to implement, it is generally not the most power efficient or the fastest. Split-capacitor techniques can be more power efficient, but have a higher complexity. A typical non-binary or "redundant" technique can be faster, but has an even higher complexity since it normally uses a non-binary search algorithm. Also, some non-binary techniques can be difficult to calibrate.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

As an optimized technique, a "redundant" split-capacitor arrangement can be used with a simple binary search algorithm as a core component of a SA-ADC. This technique provides better power efficiency (due to the split-capacitor architecture) with greater speed (due to the non-binary redundancy) with the simplicity of a binary search.

Representative implementations of devices and techniques provide analog to digital conversion of time-discrete analog inputs. A redundant split-capacitor arrangement using a binary successive approximation technique can provide a fast and power efficient ADC. For example, in one implementation, a successive approximation capacitor arrangement may include multiple capacitor arrays having non-binary bit weights (e.g., the bit weights of the capacitors in the array(s) are not scaled in a binary manner).

In various implementations, sample and hold components or circuits may be used to acquire an analog input value, and to charge the capacitor array(s) with the value. The sample and hold components may include the capacitors of the SA array(s), for example, or may be separate circuit components. Based on a binary search algorithm, the charge on the capacitors of the SA array(s) can be combined with additional potentials (a reference voltage, for example) and comparisons can be made based on the additional charge, the comparisons used to converge on a digital approximation for the analog input signal.

Various implementations and techniques for an analog to digital conversion arrangement are discussed in this disclosure. Techniques and devices are discussed with reference to example analog-to-digital converter (ADC) devices and systems illustrated in the figures. In some cases, successive-approximation ADC (SA-ADC) designs are shown and discussed. However, this is not intended to be limiting, and is for ease of discussion and illustrative convenience. The techniques and devices discussed may be applied to many of various ADC device designs, structures, and the like (e.g., direct-conversion ADC, flash ADC, ramp-compare ADC, integrating ADC (also referred to as dual-slope or multi-slope ADC), counter-ramp ADC, pipeline ADC, sigma-delta ADC, time interleaved ADC, intermediate FM stage ADC, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example ADC Arrangement

Figure 1:
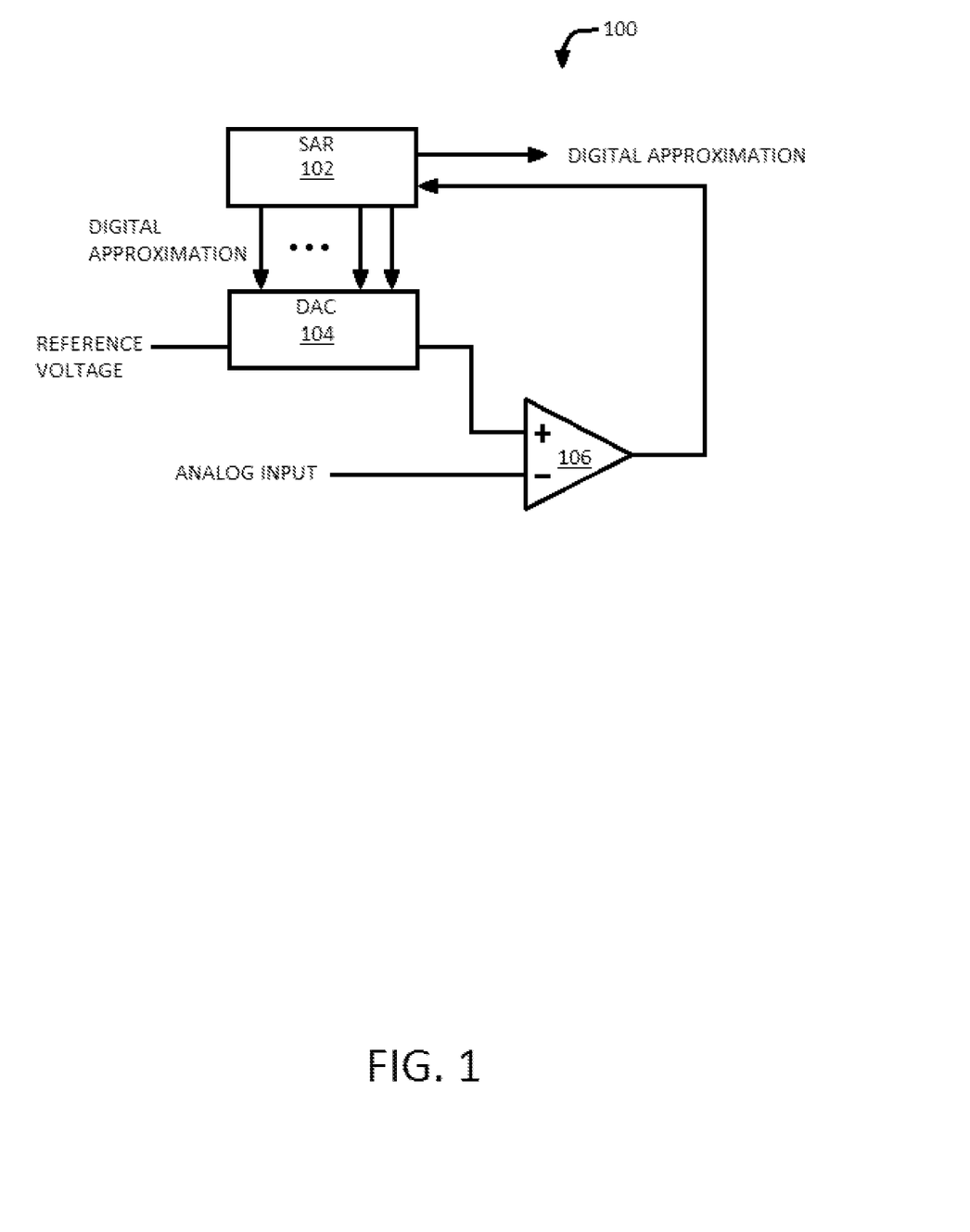
FIG. 1 is a block diagram of an example analog-to-digital converter (ADC) arrangement, wherein the techniques and devices disclosed herein may be applied, according to an implementation.

FIG. 1 is a block diagram of an example analog-to-digital conversion (ADC) arrangement 100, wherein the techniques and devices described herein may be applied. Analog signals ("analog input") are received on the input side, converted by a quantity of ADC components, and digital results ("digital output," "digital approximation," or "digital representation") are output from the ADC 100.

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like).

As shown in FIG. 1, an example ADC 100 may include a successive approximation register (SAR) component 102, a digital-to-analog converter (DAC) 104, and a comparator 106. In alternate implementations, an example ADC 100 may include fewer, additional, or alternate components.

If included, the SAR 102 is arranged to receive the analog input signal (which may be adjusted based on the output of the DAC 104 via the comparator 106) and determine a digital approximation for the analog input signal. The SAR 102 may output the digital results in a parallel fashion (such as to the DAC 104), with each bit (of multiple bits based on the resolution of the SAR 102) outputted on an individual path. Also, the SAR 102 may output the digital results in a serial form. Both of these techniques are shown in the illustration of FIG. 1. In various implementations, the output of the SAR 102 is the digital output of the ADC 100.

Resolution of the ADC 100 may be defined based on the minimum voltage level required to cause a change in the output code of the SAR 102. For example, the minimum voltage that causes a change in the digital code is the least significant bit (LSB) of the ADC 100. The resolution of the ADC 100 is the LSB voltage. In various implementations, the SAR 102 may have 8, 10, or 12 bit resolution. In alternate implementations, the SAR 102 may have fewer or greater number of bits of resolution.

Configurations and/or arrangements for the SAR 102 are discussed further below. Additionally, a process of approximating a digital value for each input signal may be according to one or more processes or algorithms, as discussed further below.

If included, the DAC 104 receives the digital output of the SAR 102, and converts it to an analog form. As shown in FIG. 1, the DAC 104 can receive the digital output of the SAR 102 via multiple bits, based on the resolution of the SAR 102. Also as shown in FIG. 1, the analog form of the digital output may be fed back, and/or combined with or compared to the analog input signal (e.g., added, subtracted, etc.). The feedback loop of the DAC 104 provides error correction to the ADC 100, as the analog form of the digital output is compared to the analog input signal, or the like.

Additionally, the ADC 100 may include one or more sample and hold components (S/H) or circuits (not shown.) In one implementation, one or more capacitors, resistors, or current sources of the SAR 102 also act as S/H components. In alternate implementations, an ADC 100 may include additional components or alternate components to perform the functions discussed, or for other desired functionality.

Figure 2:
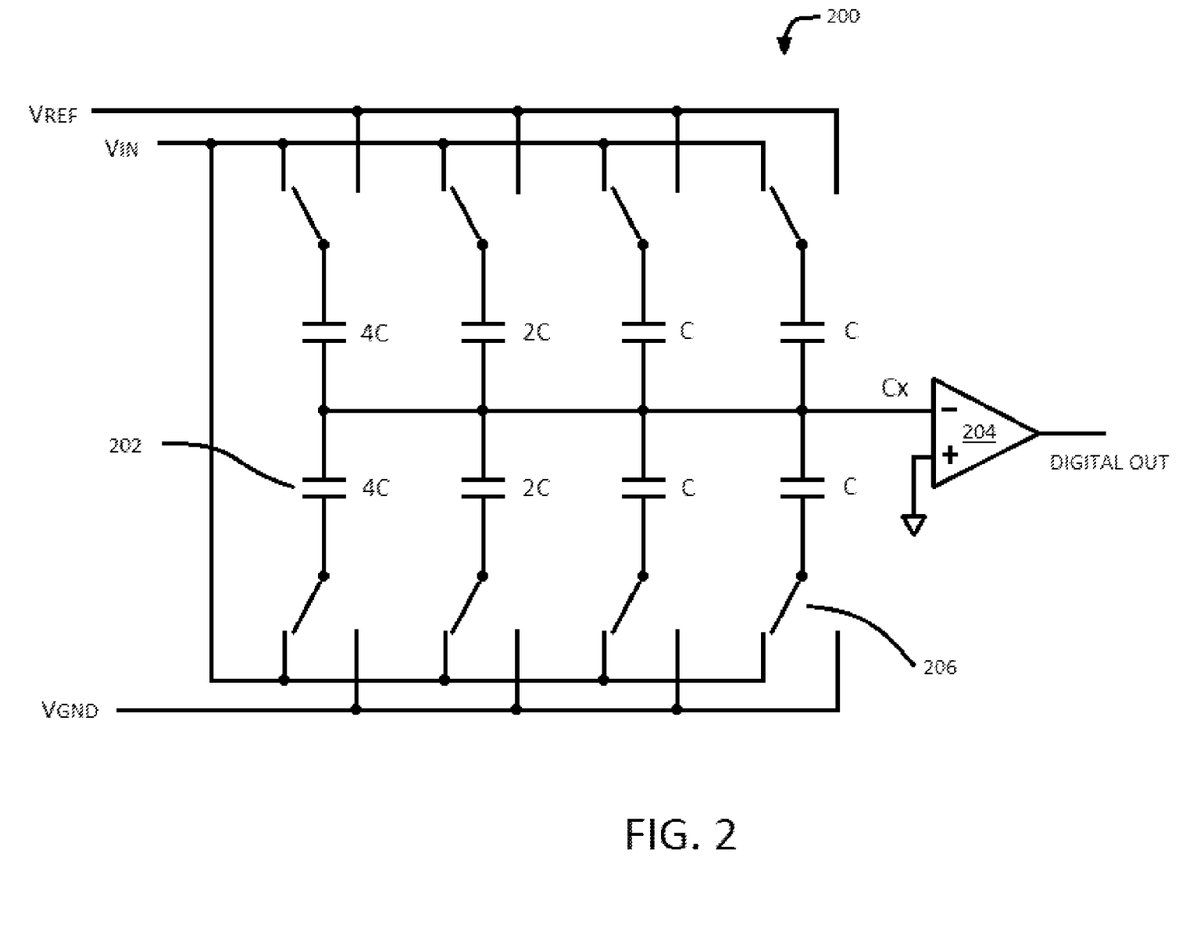
FIG. 2 is a schematic diagram of an example split-capacitor array arrangement, according to an implementation. The example array arrangement is shown as having multiple arrays of capacitances.

FIG. 2 is a schematic diagram of an example split-capacitor array arrangement 200, which may be used within the SAR 102 of FIG. 1, according to an implementation. The example array arrangement 200 is shown as having multiple arrays of capacitances 202. In an alternative implementation, the capacitances 202 are replaced with resistors. In yet another alternative implementation, the capacitances 202 are replaced with current sources. In the implementation illustrated, the arrangement 200 is comprised of two arrays. In alternate implementations, an arrangement 200 may be comprised of a greater number of arrays.

Figure 3:
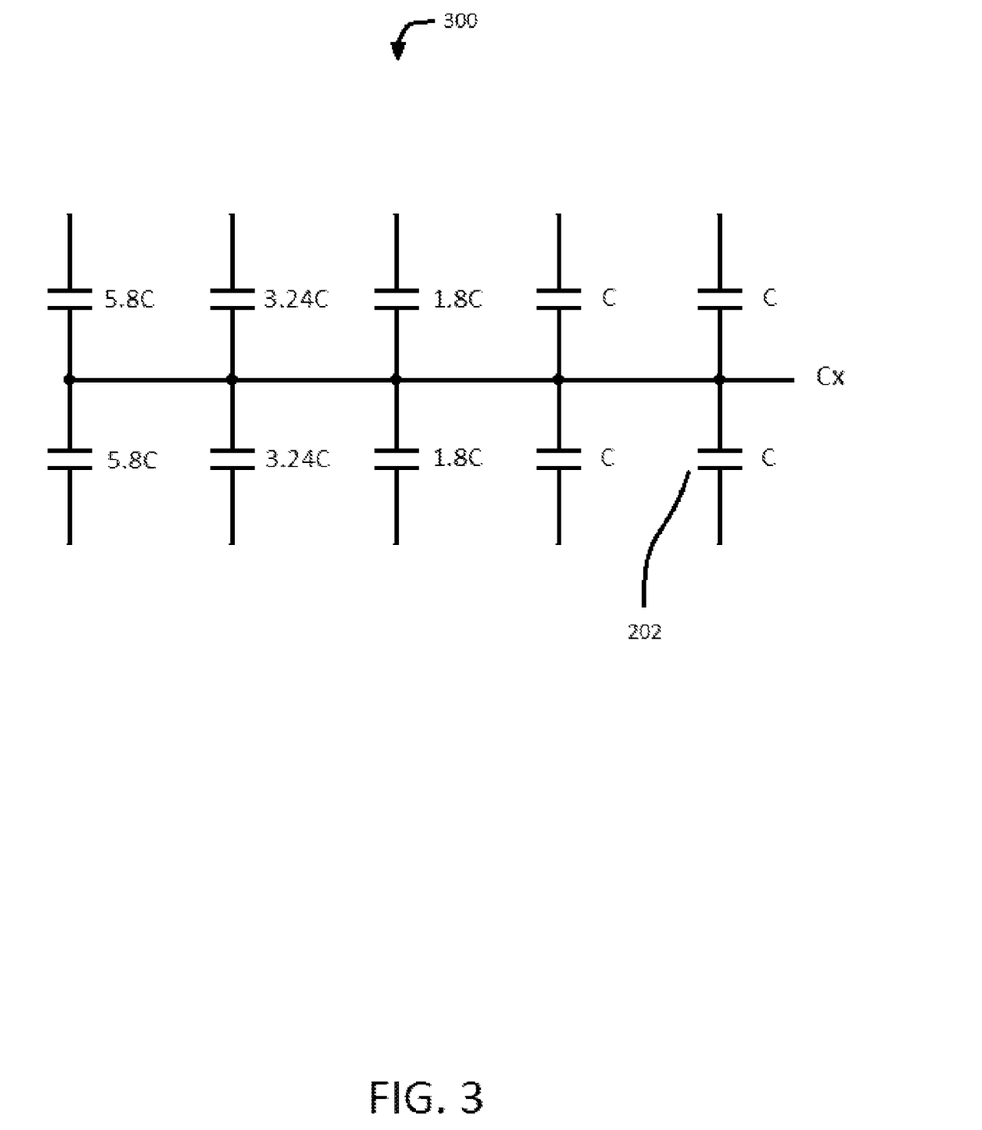
FIG. 3 is a schematic diagram of example redundant split-capacitor arrays, according to an implementation. Only the capacitor arrays are shown in FIG. 3, for clarity.
Figure 4:
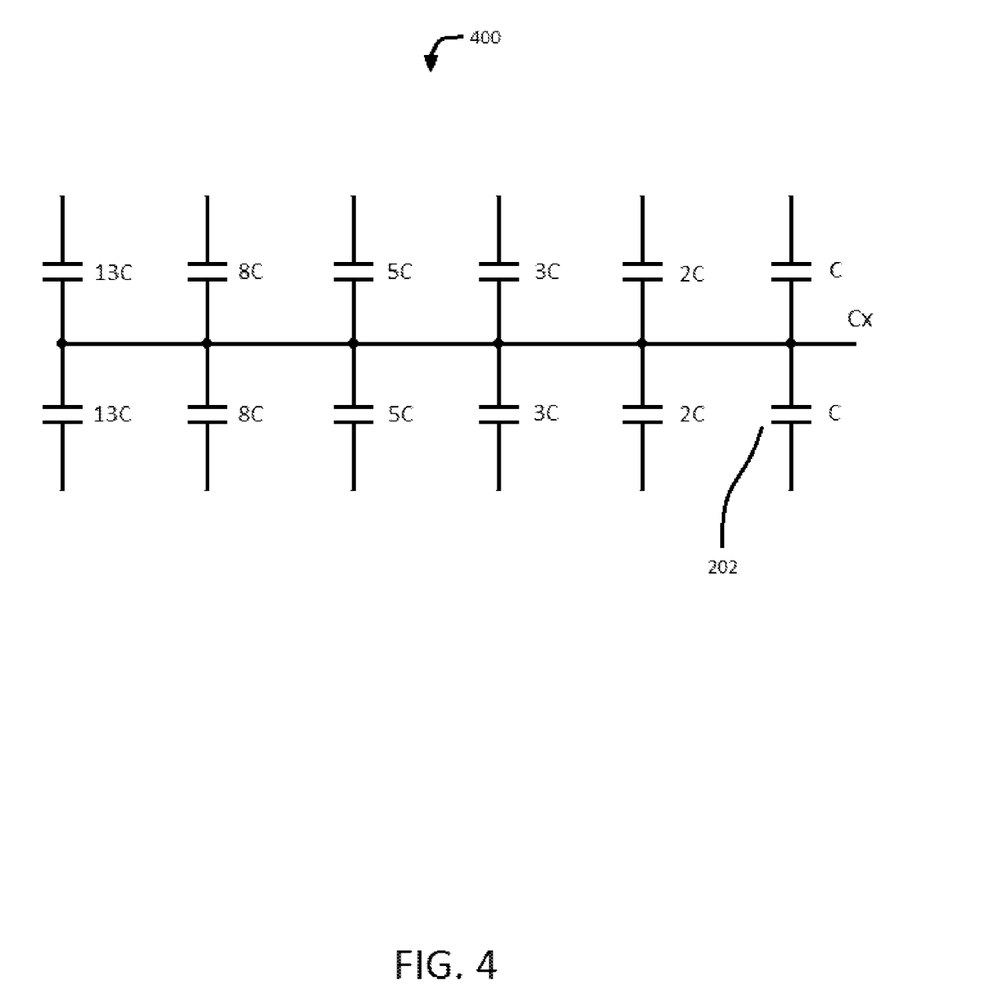
FIG. 4 is a schematic diagram of example redundant split-capacitor arrays, according to another implementation. Only the capacitor arrays are shown in FIG. 4, for clarity.

For the purposes of this disclosure, the term "split-capacitor" is used to describe a "parallel-like" array arrangement, as shown in FIGS. 2-4. For example, multiple capacitors 202 are coupled to a common node (such as node Cx, for example) to form an array. Multiple arrays (two arrays are shown in FIGS. 2-4) are coupled at their respective common nodes or are operated in a differential mode (not shown). In either case, the term "split-capacitor" refers to the way that the capacitance pairs at each bit position appear to be "split" between the multiple arrays (e.g., two arrays in FIGS. 2-4).

Other literature usage of the term "split-capacitor," may describe two or more groups of capacitors (such as a MSB group and a LSB group), where the capacitors within a group may be coupled to a common node, but groups are often separated by a buffer or a capacitance. The groups may be coupled through the buffer or capacitance, rather than to a common node, and the groups are generally not capable of being operated in a differential mode. This arrangement is referred to herein as a "buffered array." However, in an alternate implementation, two or more substantially equivalent buffered arrays may be implemented in an arrangement 200 (as arrays of the arrangement 200, for example) as otherwise described herein.

In the example shown in FIG. 2, an arrangement 200 includes multiple capacitances 202 in each array. For example, each array of the arrangement 200 includes a set of binary-weighted capacitors 202 (4C, 2C, C) where the capacitance values (or binary weights) of the capacitors 202 are based on a binary sequence (e.g., powers of 2).

In one implementation, each array of the arrangement 200 includes an additional capacitor ("C") 202 sometimes referred to as a "dummy LSB" capacitor. As shown in FIG. 2, in some implementations, the dummy LSB capacitor has a same (or substantially equivalent) capacitance value (e.g., bit weight) as a next lowest-bit capacitance 202. For example, the dummy LSB capacitor may be used to improve the accuracy of the SAR 102 (to remedy mis-decisions at a higher bit position, for example). In alternate implementations, the dummy capacitor may have a capacitance value (e.g., bit weight) that is substantially equivalent to another of the capacitances, 202, and may have another bit position within an array other than the lowest significant bit (LSB).

In alternate implementations, an arrangement 200 may be arranged such that each bit of the array(s) of the arrangement 200 is represented by a single physical component (e.g., a capacitor, resistor, current source, or the like) or by two or more physical components ("sub-elements"). Accordingly, in various implementations, one or more of the capacitances 202 of FIGS. 2-4 may be implemented using a single component or multiple sub-elements.

In an implementation, as shown in FIG. 2, the multiple arrays of the arrangement 200 are substantially identical or equivalent. In various implementations, substantially identical or equivalent may include having the same components, having equivalent components, having components with substantially equivalent capacitance values or bit weights, and the like. For example, in each of the arrays, there is an associated capacitance 202 of substantially equivalent value in the other array(s). The capacitances 202 having a substantially equivalent value may be treated as capacitance pairs or groups in some implementations.

In an implementation, an arrangement 200 includes a comparator 204 (distinct from the comparator 106) arranged to compare a voltage at the common node Cx to another potential, such as ground potential, for example. In one implementation, the digital approximation output of the ADC 100 is based on the comparison. For example, in an implementation, the output of the comparator 204 is the digital output of the ADC 100. In another example, the comparator 204 gives an indication that the closest digital approximation to the analog input has been achieved, and the digital output is based on the connections (at switches 206) of the capacitances 202 and/or capacitive pairs at that point.

Example Successive Approximation (SA) Algorithm

In various implementations, the ADC 100 may use a successive approximation (SA) algorithm, or the like, to convert sampled analog values to digital results via a binary search. An example SA algorithm is described with respect to arrangement 200 for convenience, and is also applicable to arrangements 300 and 400 (of FIGS. 3 and 4), as well as similar arrangements. The binary search is conducted through some or all possible quantization levels, and eventually converges on a digital result for the conversion.

In a first phase, the switches 206 are set into the "Vin" position, as illustrated in FIG. 2. The capacitances 202 of the arrays are charged to a time-discrete value of the analog input signal Vin. Also, the comparator 204 resets its input (e.g., a switch (not shown) may be used to reset the comparator 204 in some implementations). For ease of discussion, the reset voltage may be considered as being 0 volts at the inverting input of the comparator 204 (at the node Cx). In various implementations, however, the "reset voltage" could be any voltage, and may comprise an offset voltage. In some implementations, charge-balanced comparators 204 reset the input to a voltage of their respective decision level.

For example, in an alternate implementation, the input signal Vin may be coupled to the node Cx during the sampling phase (i.e., the first phase). In the implementation, the voltage at the node Cx may be shifted up and down during conversion, as described below, with a "reset voltage" associated with the value of Vin, however.

In a next phase, the comparator 204 input is set to a high impedance (such as an effectively infinite impedance, for example). The capacitances 202 are switched (via switches 206) to couple a first array of capacitances 202 (such as the upper array in FIG. 2, for example) to the reference voltage ("Vref") and a second array of capacitances 202 (such as the lower array in FIG. 2, for example) to the ground potential ("Vgnd").

In alternate implementations, the potential Vgnd may be at other potential values than ground potential, based on the design of the circuit 200. For example, Vgnd may be millivolts above or below ground potential, or the like. In one alternate implementation a negative reference potential −Vref, or the like, may be used as the potential Vgnd. Accordingly, for the purposes of this disclosure, use of the terms Vgnd or "ground potential" includes these and all possible potentials used as a contrasting (i.e., opposing, etc.) potential to Vref.

In the next phases, one or more of the capacitances 202 of the first array may be switched from Vref to Vgnd, and one or more capacitances 202 of the second array may be switched from Vgnd to Vref, based on comparisons made at the comparator 204. At the conclusion of the phases, each of the capacitance pairs, are set to either Vref or Vgnd. In other words, the associated capacitances 202 from the first and second arrays, that occupy a common bit-position, are set to the same potential (either Vref or Vgnd). Accordingly, the capacitances at each bit-position are not "split" but are set to the same voltage.

For example, in a scenario where Vin is a voltage greater than half the range of the ADC 100, the following may result. In the first phase, the voltage Vin is sampled to the capacitances 202 of the arrays, since all switches 206 are set to Vin. In the next phase, the capacitances 202 of a first array are set to the reference voltage ("Vref") and the capacitances 202 of a second array are set to the ground potential ("Vgnd").

Based on the voltage Vin, the potential at the inverting input of the comparator 204 (at node Cx) is less than 0 volts (or the reset voltage). This is an indication that the switch positions, with half of the capacitances 202 at Vref and half of the capacitances at Vgnd, results in a digital approximation that is too low.

In the next phase, the MSB is adjusted, so that the capacitance 202 of the MSB that was set to Vgnd is switched to Vref. This has the effect of moving the potential at Cx in a positive direction. The potential at Cx is then compared again to ground potential (or the reset voltage). (In an opposite scenario, if the input voltage Vin is a voltage less than half of the range of the ADC 100, the opposite adjustments are made to the MSB capacitances 202, resulting in an opposite effect on the potential at node Cx.)

Based on whether the potential at Cx is lower or higher than 0 volts (or the reset voltage) after adjusting the MSB capacitances 202, the next-highest bit is adjusted. If the potential at Cx is still low, then the capacitance 202 of the second array (in the next-highest bit position) is switched from Vgnd to Vref. However, if the potential at Cx is greater than 0 volts (or the reset voltage), the capacitance 202 of the first array (in the next-highest bit position) is switched from Vref to Vgnd.

The process continues through each of the bit positions, with adjustments made to a capacitance 202 at each of the bit positions, through to the LSB. In alternate implementations, more than one bit position per decision may be made during the process. At the end of the process, the potential at Cx has come as close as possible to 0 volts (or the reset voltage). Each of the capacitance pairs at each bit position has been set to either Vref or Vgnd. Accordingly, the digital approximation of the analog input voltage Vin may be read.

In one implementation, the digital approximation may be read from the switched positions of the capacitances 202. For example, the position of the capacitance pairs becomes the binary equivalent of the input voltage Vin. For each bit position, a capacitor pair set to Vref represents a digital "1" and a capacitor pair set to Vgnd represents a digital "0." In an implementation, this binary number is the desired output code for the ADC 100.

In another implementation, each pair of capacitances 202, including a capacitance 202 of the first array and an associated capacitance 202 of the second array is assigned a bit weight based on a position of the pair of capacitances 202 within the arrays. For example, the assignment may be according to a predetermined non-binary numerical pattern, as discussed further below. In the implementation, the digital approximation for the analog input value is based on a sum of the bit weights of the pairs of capacitances that are coupled (e.g., switched) to the reference voltage Vref. In an example, this sum may be expressed in a binary code, such as a binary equivalent of the sum, as the output for the ADC 100.

The previous algorithm may also be expressed in terms of equations. Assuming the sum of all of the capacitances 202 is Cs, the fraction of capacitances 202 set to Vref can be "a," where a<=1. Then, the charge value of capacitances 202 coupled to Vref can be expressed as Vref*(a*Cs) and the charge value of capacitances 202 coupled to ground can be expressed as Vgnd*(1−a)*Cs. The charge stored in all capacitances 202 together is Vin*Cs. Due to charge conservation, the voltage at node Cx after redistribution (the capacitances 202 at all bit positions have been adjusted to either Vref or Vgnd) may be expressed as:

$$a*Cs*(Vref-VCx)+(1-a)*Cs*(Vgnd-VCx)=Vin*Cs.$$

Accordingly, this equation represents charge conservation (i.e., the sum of charge stored in the capacitances tied to Vref and to Vgnd is equal to the charge stored during sampling). Using these relationships, a value for "a" can be computed that brings VCx=0, since this is what the search algorithm aims for.

$$a*Cs*Vref+Cs*Vgnd-a*Cs*Vgnd=Vin*Cs$$

$$a*(Vref-Vgnd)=Vin-Vgnd$$

$$a=(Vin-Vgnd)/(Vref-Vgnd)$$

Here, "a" is shown to be the desired conversion result, since the equation for "a" describes the input voltage difference to ground, referenced to a full-scale value of (Vref−Vgnd). If Cs can be represented as a binary number, then the value of the capacitances 202 connected to Vref corresponds to the desired binary output result. Similar equations can be derived to take into account a non-zero VCx (e.g., reset voltage) and some parasitic capacitance with a very similar results or substantially the same result.

Binary networks are very attractive for their ease of use, as shown above. However, one known problem of binary networks is that any mis-decision at a bit-position generally cannot be recovered. For example, if the input voltage Vin is slightly higher than mid-scale, but the first comparator 204 decision indicates that Vin is lower than half-scale, the MSB capacitance 202 of the first array will be switched to Vgnd. The maximum code that can result is "0111," which is inadequate for a Vin larger than half-scale. Such decision errors can occur if the algorithm is run beyond a certain speed limit, where decisions are made without sufficient settling time. The more significant bits can be especially prone to such settling problems, because their switching generates big steps in the network. Another known problem with binary networks is the potential occurrence of missing codes (code gaps) in case of a mismatch, depending on a resolution of the network.

Example Redundant Split-Capacitor Arrays

FIGS. 3 and 4 are schematic diagrams of example redundant split-capacitor arrays 300 and 400, according to various implementations. Only the capacitor arrays 300 and 400 are illustrated in FIGS. 3 and 4, for clarity. The split-capacitor arrays 300 and 400 are intended to be a direct replacement for the split-capacitor array of arrangement 200 of FIG. 2. Accordingly, the description and functionality of arrangement 200 described above apply to the split-capacitor arrays 300 and 400 as well, as implemented within the arrangement 200 and the ADC 100. Additionally, the binary search algorithm described above with respect to arrangement 200 applies equally to split-capacitor arrays 300 and 400. For example, as described above, one or more capacitances 202 of the first array of split-capacitor arrays 300 and 400 and/or one or more capacitances 202 of the second array of split-capacitor arrays 300 and 400 are coupled to the reference voltage Vref or to the ground potential Vgnd, according to a successive approximation binary search algorithm, to determine a digital approximation for the analog input.

The split-capacitor arrays 300 and 400 are non-binary redundant split-capacitor arrays. In an implementation, as shown in FIGS. 3 and 4, the split-capacitor arrays 300 and 400 comprise a first array of capacitances 202 coupled to a common node Cx. As illustrated, each successive capacitance 202 of the first array of split-capacitor arrays 300 and 400 has a capacitance value (e.g., bit weight) that is less than a capacitance value (e.g., bit weight) of a previous adjacent capacitance, according to a predetermined non-binary numerical pattern. In alternate implementations, a split-capacitor array 300 or 400 may include capacitances 202 having bit weights with a predetermined non-binary numerical pattern that is a scale or a ratio. For example, in the arrays of FIG. 3, each successive capacitance 202 is scaled by a factor of 1.8 (5.8/3.24=1.8, 3.24/1.8=1.8, 1.8/1.8=1).

In other implementations, a split-capacitor array 300 or 400 may include capacitances having bit weights with a predetermined non-binary numerical pattern that is a numerical sequence. In the example of split-capacitor array 400 of FIG. 4, the numerical pattern is a numerical sequence where the higher bit weight less the adjacent lower bit weight equals the next lower bit weight. For example, as shown in FIG. 4, 13C−8C=5C, 8C−5C=3C, 5C−3C=2C, 3C−2C=C.

In other examples, bit weights may be selected based on other criteria. For instance, in one example the bit weights may be selected based on an approximation of a geometric series. In another example, the bit weights may be selected based on being whole integer values. In another example the bit weights may be selected such that a sum of the bit weights equals a convenient-to-code value (e.g., the sum of the bit weights of array 400 of FIG. 4 equals 32, which a power of 2). In a further example, the bit weights are selected using a combination of criteria. In other implementations, a split-capacitor array 300 or 400 may have other types of numerical patterns, and the like.

As shown in FIGS. 3 and 4, split-capacitor arrays 300 and 400 include a second array of capacitances 202 coupled to the common node Cx. For example, each capacitance 202 of the first array has an associated capacitance 202 within the second array with an approximately equivalent capacitance value (e.g., bit weight). The capacitances 202 of the first array and the second array of split-capacitor arrays 300 and 400 make up capacitance pairs at each of the bit positions of the arrays. Accordingly, the first array and the second array of split-capacitor arrays 300 and 400, in combination, are arranged to determine a digital approximation for the analog input value Vin, as described above.

As shown in FIG. 3, and described above with respect to arrangement 200, the split-capacitor array 300 further comprises an additional capacitance 202 at the first and second arrays, having a capacitance value (e.g., bit weight) approximately equivalent to at least one other of the capacitances 202 of the first and second arrays. In the example shown in FIG. 3, the additional capacitance is a LSB, having a capacitance value (e.g., bit weight) substantially equivalent to the next lowest bit capacitance 202. This redundant capacitance 202 may provide some ability for the split-capacitor array 300 to compensate for a mis-decision at a higher bit-position, or the like.

For example, in various implementations, each of the capacitances 202 of the first array and the second array are assigned a bit weight based on a position of the capacitance within the respective array and according to the predetermined non-binary numerical pattern. Additionally, in one implementation, a sum of multiple consecutive (e.g., multiple lower-position) bit weights is greater than a value of a next higher position bit weight. In the example of FIG. 3, 1+1+1.8+3.24=7.04>5.8, 1+1+1.8=3.8>3.24, and so forth. In one implementation using such a non-binary (i.e., redundant) numerical pattern, there are no missing codes or code gaps for any possible analog input values.

However, in some implementations, the sum of the multiple consecutive (e.g., multiple lower-position) bit weights need not be greater than a value of a next higher position bit weight when the next higher position bit weight has a bit position lower than a predetermined bit position. In various implementations, the predetermined bit position may be one of the lower half of the bit positions of the respective array. For example, the predetermined bit position may be one or more bit positions higher than the least significant bit (LSB), or the like. In an alternate implementation, the sum of the multiple consecutive bit weights need not be greater than a value of a next higher position bit weight when one of the multiple consecutive bit weights is the least significant bit (LSB). For example, in FIG. 4, 1+2=3, being equal and not greater than 3, which is the next higher bit weight. While it may be more useful to have the sum of consecutive bit weights be greater than a value of a next higher position bit weight for the more significant bits, it may not be as useful for the lower significant bits due to the lack of big transients at that bit position.

As described with reference to FIG. 2 and arrangement 200, the split-capacitor arrays 300 and 400 are likewise arranged to determine a digital approximation for the analog input signal using a comparator 204 arranged to compare a voltage at the common node Cx to a ground potential.

Further, as described above, the voltage VCx at the common node Cx is based on one or more capacitances 202 of the first array and/or one or more capacitances 202 of the second array being coupled to a reference voltage Vref or to the ground potential Vgnd, after the first array and the second array in combination has been charged to the analog input value Vin. Also, the one or more capacitances 202 of the first array and/or the one or more capacitances 202 of the second array are coupled to the reference voltage Vref or to the ground potential Vgnd in pairs, each pair comprising a capacitance 202 of the first array and an associated capacitance of the second array 202.

In various implementations, the capacitances 202 may be switched based on control signals from one or more control components or modules, such as digital logic stages, and the like. In alternate implementations, the control components may be incorporated as a part of the ADC 100, or may be remote components with outputs received by the ADC 100.

In some implementations, the capacitances 202 may be employed for the sample and hold functionality of the ADC 100. In other implementations, additional components or modules may be used by the ADC 100 to provide sample and hold functions. For example, when the input voltage Vin is received by the ADC 100, either the capacitances 202 themselves, or another S/H component may receive the input voltage Vin, and sample and hold an instantaneous value of Vin. If another component is employed, the S/H component outputs the Vin value to the capacitances 202 during a first phase of the arrangement 200.

In alternate implementations, the switches 206 may be implemented with fast switching transistors, such as MOSFETS, or the like. Further, the capacitances 202 may be selected, and implemented, with devices having desired sample and hold properties, such as low leakage, fast charging, and the like.

As discussed above, the techniques, components, and devices described herein with respect to the implementations are not limited to the illustration in FIGS. 2-4, and may be applied to other ADC 100 and/or SAR 102 devices and designs without departing from the scope of the disclosure. In some cases, additional or alternative components may be used to implement the techniques described herein. Further, the components may be arranged and/or combined in various combinations, while resulting in a digital output. It is to be understood that an ADC 100 and/or SAR 102 may be implemented as a stand-alone device or as part of another system (e.g., integrated with other components, systems, etc.).

In various implementations, additional or alternative components may be used to accomplish the disclosed techniques and arrangements.

Example Implementations

In one implementation, the SAR 102 may include a split-capacitor array arrangement 200 that operates using a differential mode (not shown). For example, the SAR 102 may include a successive approximation (SA) capacitor array arrangement 200, which includes a split-capacitor array 300 or 400, or the like, arranged to determine a digital approximation of an analog input voltage, as described above with reference to FIGS. 2-4.

In an example, the SA capacitor array arrangement 200 includes a first array of capacitors 202 coupled to a common node, where each successive capacitor 202 of the first array has a capacitance value (e.g., bit weight) that is less than a capacitance value (e.g., bit weight) of a previous adjacent capacitor 202, according to a predetermined non-binary numerical pattern, and a second array of capacitors 202 coupled to another common node, where each capacitor 202 of the first array has an associated capacitor 202 within the second array with an approximately equivalent capacitance value (e.g., bit weight). Accordingly, the first array and the second array in combination are arranged to determine the digital approximation for the analog input value Vin.

In one example, the first array is not coupled to the second array. In other words, the common node of the first array is not coupled to the other common node of the second array. Instead, the first array and the second array operate as differential pairs. For example, the comparator 204 of the SAR 102 may be arranged to compare a voltage at the common node to a voltage at the other common node, and to output a digital value based on the comparison. In the case of a differential operation, the first and second split arrays may be steered (e.g., switched during charge redistribution) in a complementary way. In an alternate implementation, a pair of comparators 204 may be employed, one for each of the first and second arrays, and operated in a similar manner as above, with complementary comparisons for each array.

In the example, the voltage at the common node is based on one or more capacitors 202 of the first array being coupled to the reference voltage Vref or to the ground potential Vgnd and the voltage at the other common node is based on one or more capacitors 202 of the second array being coupled to the reference voltage Vref or to the ground potential Vgnd. As described above, the one or more capacitors 202 of the first array and/or the one or more capacitors 202 of the second array are coupled to the reference voltage Vref or to the ground potential Vgnd in pairs, where each pair comprises a capacitor 202 of the first array and an associated capacitor 202 of the second array. Also as described above, the capacitors 202 of the first and second arrays are coupled to either the reference voltage Vref or to the ground Vgnd according to a successive approximation binary search algorithm.

In another example, as described above, the first array is coupled to the second array (the common node of the first array is coupled to the other common node of the second array). In this example, the comparator 204 is arranged to compare an output of a combination of the first array and the second array to ground, and to output a digital value based on the comparison, as described above.

In another implementation, another differential arrangement includes two separate array arrangements 300 and/or 400 ("400" for ease of this discussion), for example, each comprising multiple arrays (such as first and second arrays as described above.). In such an implementation, an output of each of the arrays 400 may be an input of the comparator 204. The arrays 400 may be steered in a differential (e.g., complementary) manner, for instance. For example, one of the arrays 400 may receive Vin as an input to the array 400, and the other of the arrays 400 may receive −Vin as an input to the array 400. Further, the arrays 400 may have the Vref and Vgnd inputs opposite to each other (e.g., capacitances 202 connected to Vref and Vgnd in one array 400 are connected to Vgnd and Vref in the other array 400, etc.).

In an additional implementation of the differential arrangement described, a tri-level algorithm may be used to perform the analog-to-digital conversion within the arrays 400. In some implementations, the use of the tri-level algorithm saves additional power of operation. For example, to perform a transition from Vref to Vgnd (or Vgnd to Vref in the complementary array 400) during a successive approximation binary search, an additional phase may be inserted in the binary algorithm described above. Rather than coupling the capacitances 202 to the transition target voltage immediately, as described above, the two capacitances 202 may be coupled together during the additional phase. Then, the two capacitances 202 may be coupled to the transition target voltage in a next phase, as described above. Since less than 100% of the required charge per capacitance 202 is taken from the target voltage source, based on sharing charge between the capacitances 202 during the additional phase, some power may be saved.

Representative Process

Figure 5:
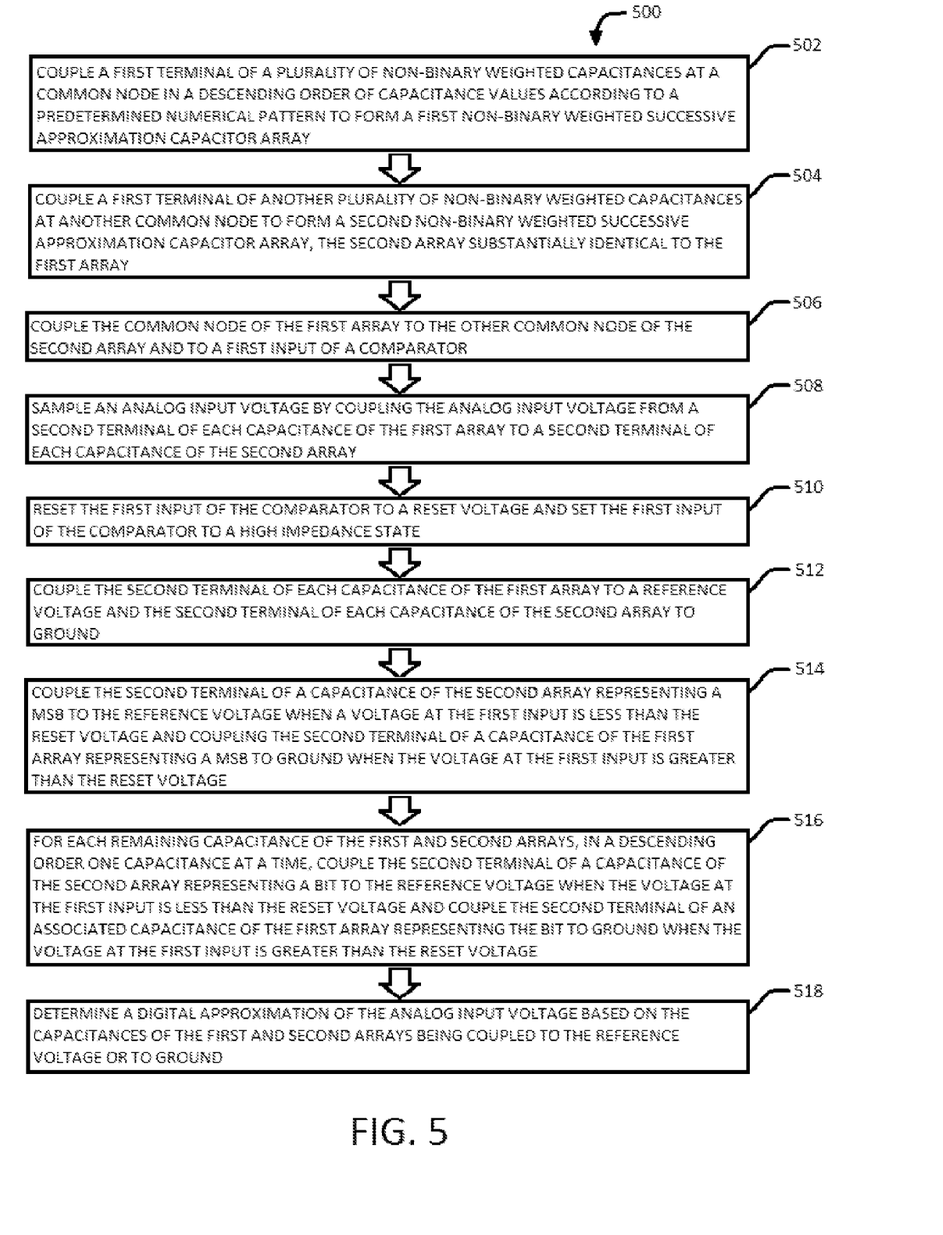
FIG. 5 is a flow diagram illustrating an example process for providing analog to digital conversion using a redundant split-capacitor array arrangement, according to an implementation.

FIG. 5 is a flow diagram illustrating an example process 500 for providing analog to digital conversion of time-discrete analog inputs, according to an implementation. The process 500 describes using a binary successive approximation algorithm with a non-binary successive approximation ADC (such as ADC 100). For example, a successive approximation register SAR component (such as SAR 102, for example) may include a redundant split-capacitor array arrangement. In various implementations, the bit weights of the redundant split-capacitor arrays are based on a predetermined non-binary numerical pattern. The process 500 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 502, the process 500 includes coupling a first terminal of a plurality of non-binary weighted capacitances (such as capacitances 202, for example) at a common node in a descending order of capacitance values (e.g., bit weights) according to a predetermined numerical pattern to form a first non-binary weighted successive approximation capacitor array. In various implementations, the numerical pattern may comprise a non-binary scale, a non-binary ratio, a non-binary numerical sequence, or the like.

At block 504, the process includes coupling a first terminal of another plurality of non-binary weighted capacitances (such as capacitances 202, for example) at another common node to form a second non-binary weighted successive approximation capacitor array, the second non-binary weighted successive approximation capacitor array substantially identical to the first non-binary weighted successive approximation capacitor array. For example, each capacitance of the first array has an associated capacitance of the second array having a substantially equivalent capacitance value or bit weight.

At block 506, the process includes coupling the common node of the first array to the other common node of the second array and to a first input of a comparator (such as comparator 204, for example). In such an example, the process includes coupling a second input of the comparator to ground. In an alternate implementation, the process includes not coupling the common node of the first array to the other common node of the second array, but operating the first and second arrays in a differential mode. In such an example, the common node of the first array and the other common node of the second array comprise the inputs to the comparator.

At block 508, the process includes sampling an analog input voltage by coupling the analog input voltage from a second terminal of each capacitance of the first array to a second terminal of each capacitance of the second array.

At block 510, the process includes resetting the first input of the comparator to a reset voltage (such as 0 volts, for example) and setting the first input of the comparator to a high impedance state. At block 512, the process includes coupling the second terminal of each capacitance of the first array to a reference voltage and the second terminal of each capacitance of the second array to ground.

At block 514, the process includes coupling the second terminal of a capacitance of the second array representing a most significant bit (MSB) to the reference voltage when a voltage at the first input is less than the reset voltage and coupling the second terminal of a capacitance of the first array representing a MSB to ground when the voltage at the first input is greater than the reset voltage.

At block 516, the process includes, for each remaining capacitance of the first and second arrays, in a descending order one capacitance at a time, coupling the second terminal of a capacitance of the second array representing a bit to the reference voltage when the voltage at the first input is less than the reset voltage and coupling the second terminal of an associated capacitance of the first array representing the bit to ground when the voltage at the first input is greater than the reset voltage.

At block 518, the process includes determining a digital approximation of the analog input voltage based on the capacitances of the first and second arrays being coupled to the reference voltage or to ground. For example, in one implementation, the process includes determining a digital approximation of the analog input voltage by assigning a 1 bit to a substantially equivalent pair of capacitances coupled to the reference voltage and assigning a 0 bit to a substantially equivalent pair of capacitances coupled to ground. In the implementation, the digital approximation is read from the bits, assigned as described.

In another implementation, the process includes determining a digital approximation of the analog input voltage by assigning a bit weight to each capacitance of the first and second arrays based on a position of the capacitance within the respective array and according to the numerical pattern. In the implementation, the process includes determining a digital approximation of the analog input voltage by summing bit weights of capacitances coupled to the reference voltage and representing a sum with a binary representation code. For example, the binary representation code may comprise binary coded decimal (BCD), a base-two representation of the sum, or the like.

In alternate implementations, other techniques may be included in the process 500 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
   a first array of capacitances coupled to a common node, each successive capacitance of the first array having a capacitance value that is less than a capacitance value of a previous adjacent capacitance, according to a predetermined non-binary numerical pattern; and
   a second array of capacitances coupled to the common node, each capacitance of the first array having an associated capacitance within the second array with an approximately equivalent capacitance value, the first array and the second array in combination arranged to determine a digital approximation for an analog input value,
   wherein the voltage at the common node is based on one or more capacitors of the first array being coupled to a reference voltage or to the ground potential and the voltage at the other common node is based on one or more capacitors of the second array being coupled to the reference voltage or to the ground potential, the one or more capacitors of the first array and/or the one or more capacitors of the second array being coupled to the reference voltage or to the ground potential in pairs, each pair comprising a capacitor of the first array and an associated capacitor of the second array, according to a search algorithm.

2. The apparatus of claim 1, further comprising a comparator arranged to compare a voltage at the common node to a ground potential, the digital approximation based on the comparison.

3. The apparatus of claim 2, wherein the voltage at the common node is based on one or more capacitances of the first array and/or one or more capacitances of the second array being coupled to a reference voltage or to the ground potential, after the first array and the second array in combination has been charged to the analog input value.

4. The apparatus of claim 3, wherein the one or more capacitances of the first array and/or one or more capacitances of the second array are coupled to the reference voltage or to the ground potential in pairs, each pair comprising a capacitance of the first array and an associated capacitance of the second array.

5. The apparatus of claim 3, wherein the one or more capacitances of the first array and/or one or more capacitances of the second array are coupled to the reference voltage or to the ground potential according to a successive approximation binary search algorithm.

6. The apparatus of claim 1, the first array and the second array each further comprising an additional capacitance having a capacitance value approximately equivalent to at least one other of the capacitances of the first and second arrays.

7. The apparatus of claim 1, wherein the predetermined non-binary numerical pattern is a scale or a ratio.

8. The apparatus of claim 1, wherein the predetermined non-binary numerical pattern is a numerical sequence.

9. The apparatus of claim 1, wherein each of the capacitances of the first array and the second array are assigned a bit weight based on a position of the capacitance within the respective array and according to the predetermined non-binary numerical pattern, a sum of multiple consecutive bit weights being greater than a value of a next higher position bit weight.

10. The apparatus of claim 9, wherein the sum of the multiple consecutive bit weights need not be greater than a value of a next higher position bit weight when the next higher position bit weight has a bit position lower than a predetermined bit position.

11. The apparatus of claim 1, wherein one or more capacitances of the first array and/or the second array are comprised of multiple capacitive elements.

12. The apparatus of claim 1, wherein a pair of capacitances including a capacitance of the first array and an associated capacitance of the second array is assigned a bit weight based on a position of the pair of capacitances within the arrays and according to the predetermined non-binary numerical pattern, the digital approximation for the analog input value based on a sum of bit weights of pairs of capacitances coupled to a reference voltage.

13. An analog-to-digital converter (ADC), comprising:
    a successive approximation (SA) capacitor array arranged to determine a digital approximation of an analog input voltage, the SA capacitor array including:
    a first array of capacitors, each successive capacitor of the first array having a capacitance value that is less than a capacitance value of a previous adjacent capacitor, according to a predetermined non-binary numerical pattern, and
    a second array of capacitors, each capacitor of the first array having an associated capacitor within the second array with an approximately equivalent capacitance value, the first array and the second array in combination arranged to determine the digital approximation for the analog input value;
    a digital-to-analog converter (DAC) arranged to determine an analog value of the digital approximation; and
    a first comparator arranged to compare the analog input voltage to the output of the DAC, and to output a comparison error,
    wherein the voltage at the common node is based on one or more capacitors of the first array being coupled to a reference voltage or to the ground potential and the voltage at the other common node is based on one or more capacitors of the second array being coupled to the reference voltage or to the ground potential, the one or more capacitors of the first array and/or the one or more capacitors of the second array being coupled to the reference voltage or to the ground potential in pairs, each pair comprising a capacitor of the first array and an associated capacitor of the second array, according to a successive approximation binary search algorithm.

14. The ADC of claim 13, the SA capacitor array further comprising a second comparator arranged to compare an output of a combination of the first array and the second array to ground, and to output a digital value based on the comparison.

15. The ADC of claim 13, the SA capacitor array further comprising a second comparator arranged to compare a voltage at a common node associated with the first array of capacitors to a voltage at another common node associated with the second array or capacitors, and to output a digital value based on the comparison.

16. A method, comprising:
coupling a first terminal of a plurality of non-binary weighted capacitances at a common node in a descending order of capacitance values according to a predetermined numerical pattern to form a first non-binary weighted successive approximation capacitor array;
coupling a first terminal of another plurality of non-binary weighted capacitances at another common node to form a second non-binary weighted successive approximation capacitor array, the second non-binary weighted successive approximation capacitor array substantially identical to the first non-binary weighted successive approximation capacitor array;
coupling the common node of the first array to the other common node of the second array and to a first input of a comparator;
sampling an analog input voltage by coupling the analog input voltage from a second terminal of each capacitance of the first array to a second terminal of each capacitance of the second array;
resetting the first input of the comparator to a reset voltage and setting the first input of the comparator to a high impedance state;
coupling the second terminal of each capacitance of the first array to a reference voltage and the second terminal of each capacitance of the second array to ground;
coupling the second terminal of a capacitance of the second array representing a most significant bit (MSB) to the reference voltage when a voltage at the first input is less than the reset voltage and coupling the second terminal of a capacitance of the first array representing a MSB to ground when the voltage at the first input is greater than the reset voltage;
For each remaining capacitance of the first and second arrays, in a descending order one capacitance at a time, coupling the second terminal of a capacitance of the second array representing a bit to the reference voltage when the voltage at the first input is less than the reset voltage and coupling the second terminal of an associated capacitance of the first array representing the bit to ground when the voltage at the first input is greater than the reset voltage; and
determining a digital approximation of the analog input voltage based on the capacitances of the first and second arrays being coupled to the reference voltage or to ground.

17. The method of claim 16, further comprising determining a digital approximation of the analog input voltage by assigning a 1 bit to a substantially equivalent pair of capacitances coupled to the reference voltage and assigning a 0 bit to a substantially equivalent pair of capacitances coupled to ground.

18. The method of claim 16, further comprising assigning a bit weight to each capacitance of the first and second arrays based on a position of the capacitance within the respective array and according to the numerical pattern.

19. The method of claim 18, further comprising determining a digital approximation of the analog input voltage by summing bit weights of capacitances coupled to the reference voltage and representing a sum with a binary representation code.

20. The method of claim 19, wherein the binary representation code comprises binary coded decimal (BCD).

21. The method of claim 19, wherein the binary representation code comprises a base-two representation of the sum.

22. The method of claim 16, further comprising coupling a second input of the comparator to ground.

23. The method of claim 16, wherein the numerical pattern comprises a non-binary scale or a non-binary ratio.

24. The method of claim 16, wherein the numerical pattern comprises a non-binary numerical sequence.

* * * * *